(12) United States Patent
Watts

(10) Patent No.: US 7,857,267 B2
(45) Date of Patent: Dec. 28, 2010

(54) UNIQUE MOUNTING FOR COMPUTER EQUIPMENT IN FRAMES

(75) Inventor: Ronald Franklin Watts, Lewisville, TX (US)

(73) Assignee: Alcatel Lucent, Paris (FR)

( * ) Notice: Subject to any disclaimer, the term of this patent is extended or adjusted under 35 U.S.C. 154(b) by 689 days.

(21) Appl. No.: 11/818,136

(22) Filed: Jun. 13, 2007

(65) Prior Publication Data

US 2008/0310083 A1    Dec. 18, 2008

(51) Int. Cl.
*F16M 11/00*  (2006.01)
*A47G 29/00*  (2006.01)
*A47G 19/08*  (2006.01)
*H05K 5/00*  (2006.01)
*H05K 7/16*  (2006.01)
*H05K 7/00*  (2006.01)

(52) U.S. Cl. ............ 248/200; 248/674; 248/675; 211/41.12; 361/724; 361/725; 361/729; 312/265.1; 312/265.2; 312/265.3

(58) Field of Classification Search ........... 248/200, 248/674–675; 211/26, 189, 103, 187, 190, 211/207, 191, 41.12, 41.17; 361/679, 724, 361/725, 726, 727, 729, 730, 731, 732, 733; 312/265.1, 265.2, 265.3, 265.4, 334.4, 293.1–293.3
See application file for complete search history.

(56) References Cited

U.S. PATENT DOCUMENTS

| | | | |
|---|---|---|---|
| 5,709,359 A | 1/1998 | Riley | |
| 5,803,427 A * | 9/1998 | Huang | 248/674 |
| 6,079,173 A * | 6/2000 | Waalkes et al. | 52/239 |
| 6,269,959 B1 * | 8/2001 | Haworth | 211/26 |
| 6,615,992 B1 * | 9/2003 | Lauchner et al. | 211/26 |
| 6,681,942 B2 * | 1/2004 | Haney | 211/183 |
| 6,909,609 B1 * | 6/2005 | Chen | 361/724 |
| 6,974,037 B2 * | 12/2005 | Haney | 211/26 |
| 7,038,915 B2 | 5/2006 | King et al. | |
| 7,360,659 B1 * | 4/2008 | Yoon et al. | 211/26 |
| 2003/0019824 A1 * | 1/2003 | Gray | 211/26 |
| 2003/0116514 A1 | 6/2003 | Broome | |

* cited by examiner

*Primary Examiner*—Terrell Mckinnon
*Assistant Examiner*—Christopher Garft
(74) *Attorney, Agent, or Firm*—Garlick Harrison & Markison

(57) ABSTRACT

A mounting assembly is provided for mounting equipment on a frame including a front pair of vertical rails and a back pair of vertical rails. The mounting assembly includes a bracket for attaching a front side of the equipment to one of the front rails and a hinge for attaching a back side of the equipment to one of the back rails.

14 Claims, 4 Drawing Sheets

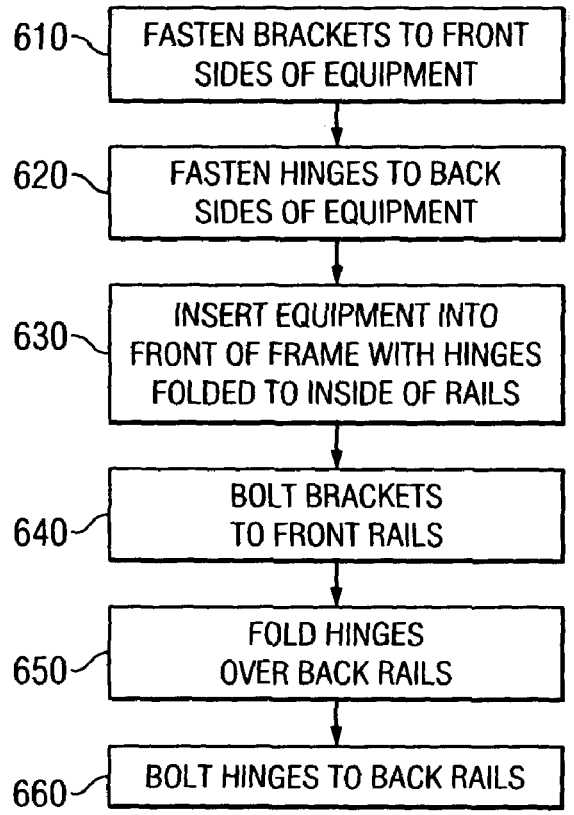
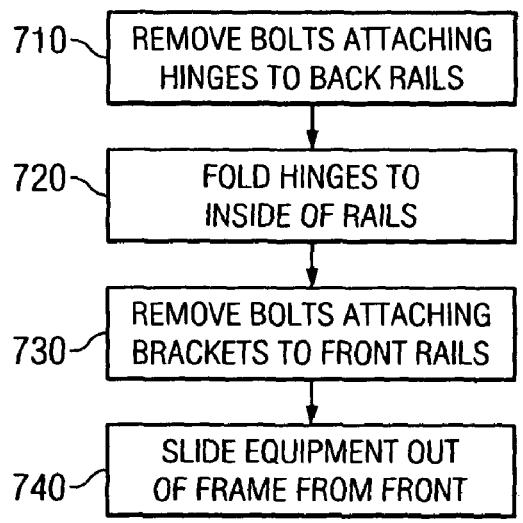

UNIQUE MOUNTING FOR COMPUTER EQUIPMENT IN FRAMES

BACKGROUND OF THE INVENTION

1. Technical Field of the Invention

The present invention relates in general to mounting brackets, and in particular, to mounting brackets for mounting computer equipment in frames.

2. Description of Related Art

Computer equipment is typically mounted in frames that contain two pairs of mounting rails, one pair near the front of the frame, and another pair near the back. An example of such a frame is a standardized EIA 310-D frame. An EIA 310-D frame's mounting fixture includes two pairs of parallel rails standing vertically. Each rail is 0.625 inches wide and each pair of rails is separated by a gap of 17.75 inches, giving the frame an overall width of 19 inches. The rails have matching holes in them spaced at regular intervals, so that each pair of holes on a corresponding pair of rails has a center-to-center distance of 18.3 inches.

Rack-mountable equipment is typically mounted by bolting the front panel of the equipment to the frame. For example, brackets can be attached to the front sides of the equipment and bolted to the front pair of rails via respective holes. To stabilize the equipment, brackets are also used to mount the back sides of the equipment to the back pair of rails.

Since the brackets are normally attached to the sides of the equipment near the front and back of the equipment, the equipment can only be removed from the rack if there is access to the side of the frame, so that the bracket bolts can be removed from the equipment itself. However, when equipment is installed in a frame and the frame is installed in a central office or computer room, normally other frames are installed on either side, making side access to the frame difficult. For example, when there is a failure of one piece of equipment in the frame, it is impossible to remove and replace the failed equipment without taking the frame out of the lineup to achieve side panel access. If the other equipment in the frame is critical, it may be unacceptable to take the frame out of service to perform removal and replacement of a single piece of equipment. In addition, in most cases it requires two people to replace a piece of equipment, one in the front of the frame and one in the back.

One solution to the problem of side access is to use slide rails to mount and support the computer equipment. Typically, the slide rails are mounted directly onto the frame, and then equipment then slides into the frame along the slide rails. However, slide rails are expensive. For example, one set of slide rails may cost in excess of $250. In addition, slide rails use a lot of metal for a relatively simple function, are fairly complex to install and are complicated to manufacture and customize for new hardware. Therefore, what is needed is a different mounting technique for mounting computer equipment to frames.

SUMMARY OF THE INVENTION

Embodiments of the present invention provide a mounting assembly for mounting equipment on a frame. The frame includes a front pair of vertical rails and a back pair of vertical rails. The mounting assembly includes a bracket for attaching a front side of the equipment to one of the front rails and a hinge for attaching a back side of the equipment to one of the back rails.

In one embodiment, the hinge is moveable between an extended position for moving the equipment relative to the frame and a folded position for attaching the equipment to the frame. The extended position enables the equipment to be inserted into and removed from the frame via a front of the frame that is defined by the front pair of rails. In an exemplary embodiment, the extended position is such that an extended portion of the hinge extending out from the equipment is inside of the rails and the folded position is such that the extended portion of the hinge is folded over one of the back rails.

In a further embodiment, the bracket has a first aperture therein for receiving a first fastener for attaching the bracket to the front side of the equipment and a second aperture therein for receiving a second fastener for attaching the bracket to the front rail. In addition, the hinge has a first aperture therein for receiving a third fastener for attaching the hinge to the back side of the equipment and a second aperture therein for receiving a fourth fastener for attaching the hinge to the back rail. Furthermore, each rail within the front and back pairs of rails has vertically spaced and aligned apertures therein for receiving the second and fourth fasteners.

Embodiments of the present invention further provide a mounting assembly for mounting equipment on a frame having a front pair of vertical rails defining a front of the frame and a back pair of vertical rails defining a back of the frame. The mounting assembly includes a pair of brackets for attaching respective front sides of the equipment to respective ones of the front pair of rails and a pair of hinges attaching respective back sides of the equipment to respective ones of the back pair of rails in a folded position and for inserting the equipment into and removing the equipment from the front of the frame in an extended position.

Embodiments of the present invention still further provide a method for mounting equipment on a frame having a front pair of vertical rails defining a front of the frame and a back pair of vertical rails defining a back of the frame. The method includes fastening respective brackets to respective front sides of the equipment, fastening respective hinges to respective back sides of the equipment and inserting the equipment into the front of the frame with the hinges in an extended position such that extended portions of the hinges extending out from the equipment are inside of the rails. The method further includes attaching the brackets to respective ones of the front pair of rails, moving the hinges to a folded position such that the extended portions of the hinges are folded over respective ones of the back pair of rails and attaching the hinges to the respective ones of the back pair of rails.

In a further embodiment, the method also includes inserting the equipment into the front of the frame until the brackets abut the front pair of rails and threading respective bolts through respective apertures in the brackets and the front pair of rails to secure the equipment to the front pair of rails. In addition, the method also includes threading respective bolts through respective apertures in the extended portions of the hinges and the back pair of rails to secure the equipment to the back pair of rails.

In still a further embodiment, the method also includes removing the equipment from the frame. In an exemplary embodiment, the method includes detaching the hinges from the respective ones of the back pair of rails, moving the hinges to the extended position, detaching the brackets from the respective ones of the front pair of rails and sliding the equipment out of the frame through the front of the frame.

BRIEF DESCRIPTION OF THE DRAWINGS

A more complete understanding of the present invention may be obtained by reference to the following detailed description when taken in conjunction with the accompanying drawings wherein:

FIG. 6 is a flowchart illustrating an exemplary process for mounting equipment in a frame in accordance with embodiments of the present invention; and FIG. 7 is a flowchart illustrating an exemplary process for removing mounted equipment from a frame in accordance with embodiments of the present invention.

DETAILED DESCRIPTION OF THE DRAWINGS

Figure 1:
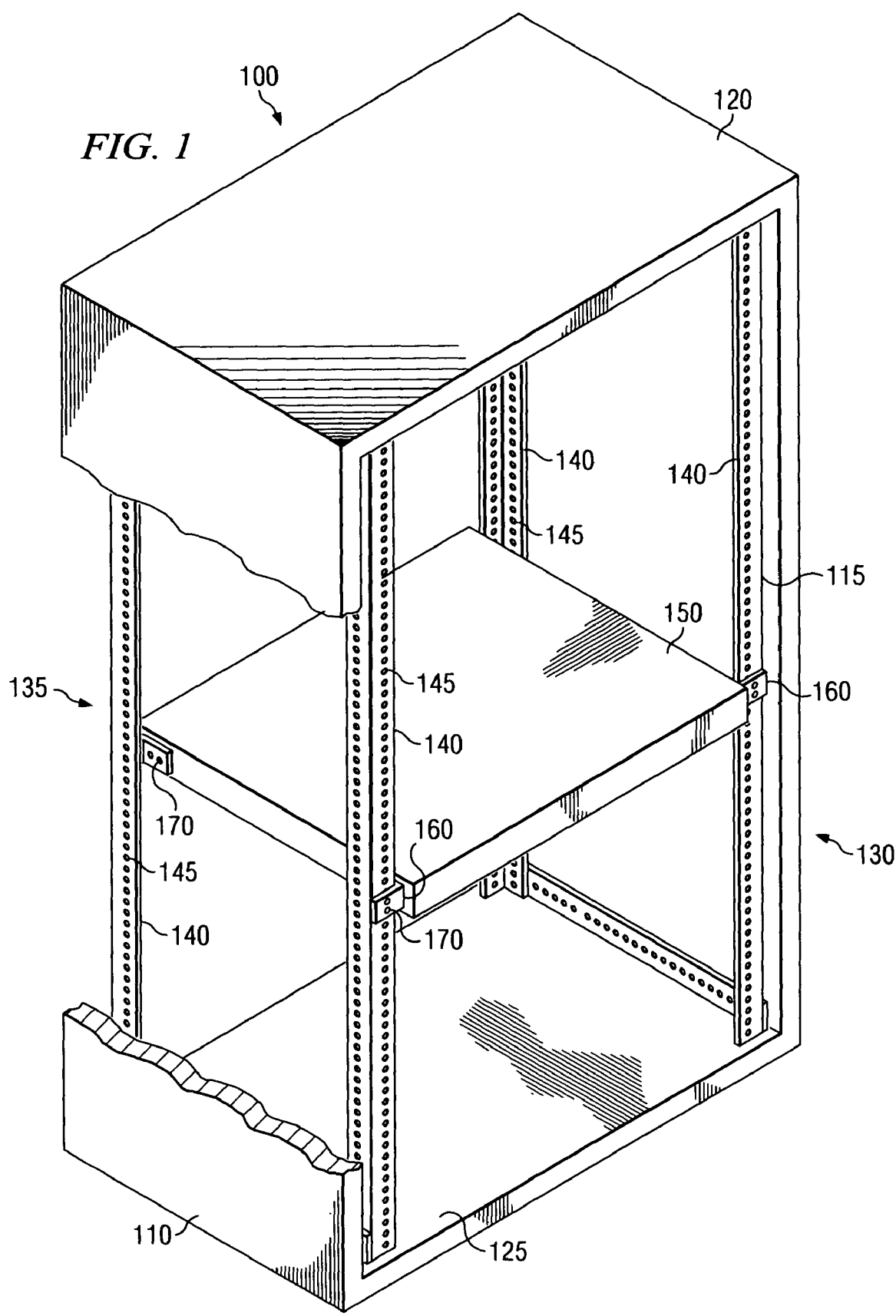
FIG. 1 is a perspective view of an exemplary frame having rails for mounting equipment, in accordance with embodiments of the present invention.

Referring to FIG. 1, a perspective view of a frame 100 for use in various embodiments of the present invention is shown. The frame 100 is capable of mounting computer equipment 150 (e.g., servers, processors, disk drives, memory devices) and other types of electrical equipment, such as test instruments, telecommunications equipment and audio/video equipment. The frame 100 includes optional side panels 110 and 115, a top panel 120, a base support panel 125, and a two pairs of parallel rails 140 standing vertically. The rails 140 are connected to the top panel 120 and the base support panel 125 to form the frame 140. The side panels 110 and 115, if included, are also connected to the base support panel 125, the top panel 140 and the rails 140. In other embodiments, the side panels 110 and 115 may cover only portions of the sides of the frame 100. The front 130 of the frame 100 is open to receive the equipment 150. In addition, as shown in FIG. 1, the back 135 of the frame 100 is also open to enable the equipment 150 to be electrically connected to other equipment (not shown) mounted in the frame 100.

Two of the rails 140 are shown aligned along the front 130 of the frame 100 forming a front pair of rails 140, while the other two rails 140 are shown aligned along the back 135 of the frame 100 forming a back pair of rails 140. Each of the rails 140 includes a plurality of apertures 145 or mounting holes that enables the equipment 150 to be mounted in the frame 100 using brackets 160 and appropriate fasteners 170, such as screws or bolts. For example, the mounting holes 145 on the front pair of rails 140 enables the equipment 150 to be secured to the front 130 of the frame 100, while the mounting holes 145 on the back pair of rails 140 enables the equipment 150 to be secured to the back 135 of the frame 100.

In one embodiment, the dimensions and spacing of the rails 140 and mounting holes 145 are constructed in accordance with the specifications of the Electronic Industries Association standard EIA-310-D. For example, in the EIA-310-D standard, the mounting holes 145 are spaced at regular intervals along the rails 140, with all rails 140 matching, so that each mounting hole 145 is a part of a horizontal pair of mounting holes 145 (e.g., corresponding mounting holes 145 between the two front rails 140 or the two back rails 140).

Figure 2:
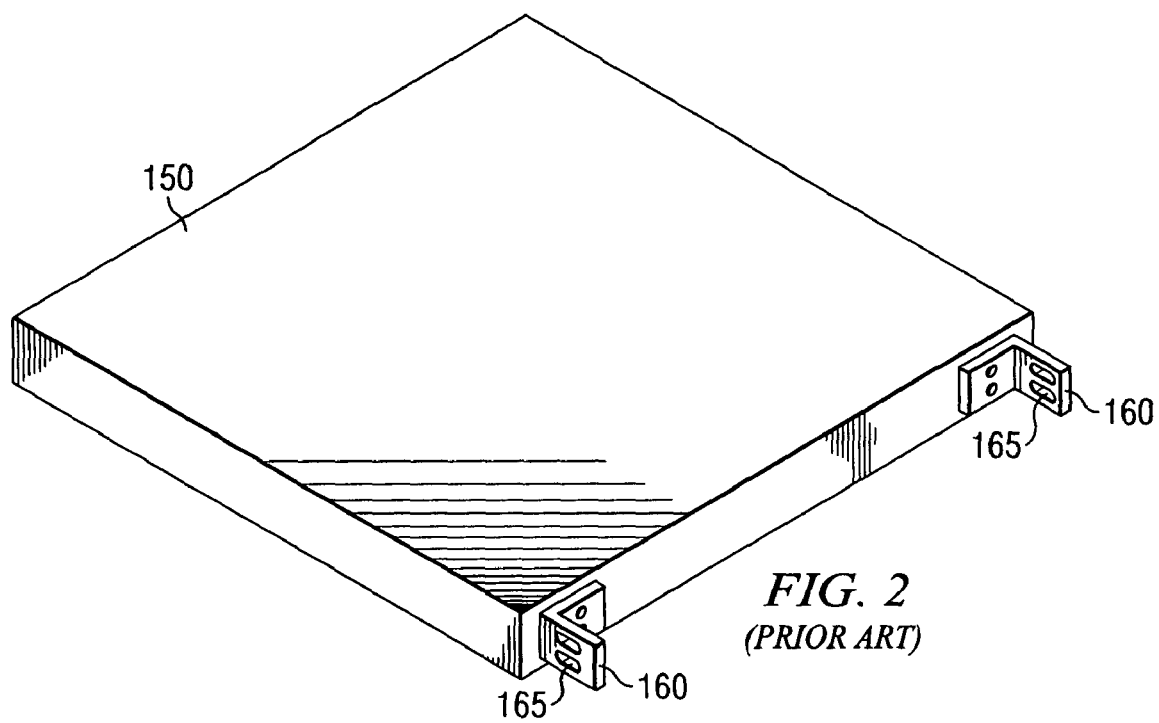
FIG. 2 is a perspective view of a prior art mounting assembly for mounting the equipment using brackets on the front and back of the equipment.
Figure 3:
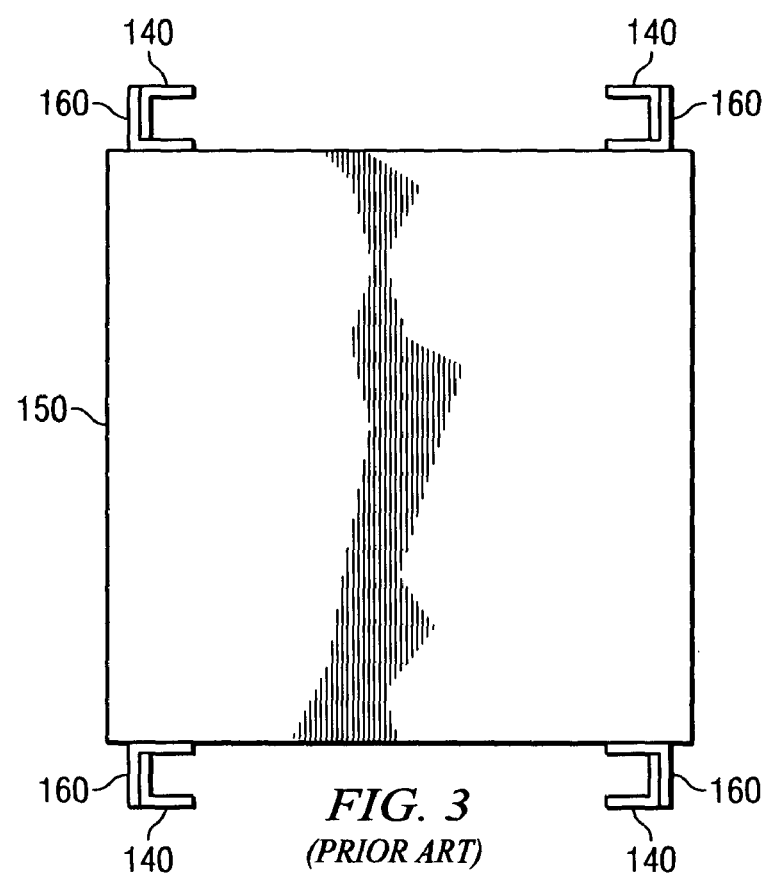
FIG. 3 is a top view of the prior art mounting assembly.

FIGS. 2 and 3 depict a piece of equipment 150 that is conventionally mounted and secured in the frame. FIG. 2 provides a perspective view of one side of the equipment 150, while FIG. 3 provides a top view of the equipment 150 as mounted in the frame. The equipment 150 is shown having brackets 160 attached to the front sides and back sides thereof. Each bracket 160 is an angle metal bracket that has a pattern of apertures 165 or mounting holes on both faces designed to match the mounting hole spacing on the equipment 150 and the frame rails 140.

To mount the equipment 150, as conventionally shown in FIGS. 2 and 3, one bracket 160 is attached to each front side of the equipment 150 by, for example, threading screws or other fasteners through both the mounting holes 165 on the equipment-face of the brackets 160 and the corresponding mounting holes on the front sides of the equipment 150. When the brackets 160 are attached to the opposing front sides of the equipment 150, the equipment 150 can be mounted to the front pair rails 140 in the frame by inserting the equipment into the front of the frame until the brackets 160 abut the front pair of rails 140, and then threading bolts or other fasteners through the mounting holes 165 on the frame-face of the brackets 160 and corresponding mounting holes on the front rails 140 of the frame.

Once the equipment 150 is mounted to the front pair of rails 140, brackets 160 can be attached to the back sides of the equipment 150 by accessing the equipment 150 through the sides of the frame (e.g., by removing the side panels of the frame). For example, the equipment-face of the brackets 160 can be slid through an opening between the back frame rails 140 and the equipment 150, and with access to the sides of the equipment 150, the brackets 160 can be attached to the back sides of the equipment 150 by, for example, threading screws or other fasteners through both the mounting holes 165 on the equipment-face of the brackets 160 and the corresponding mounting holes on the back sides of the equipment 150. To secure the equipment to the back of the frame, bolts or other fasteners can be threaded through the mounting holes 165 on the frame-face of the brackets 160 and corresponding mounting holes on the back rails 140 of the frame.

Likewise, to remove the equipment 150 from the frame, the back brackets 160 must be removed to allow the equipment 150 to be slid out of the front of the frame. In order to remove the back brackets 160, side access to the equipment 150 is again necessary. For example, to remove the back brackets, the brackets 160 must be detached from the back sides of the equipment 150 by removing the fasteners attaching the equipment-face of the brackets to the back sides of the equipment 150.

Figure 4:
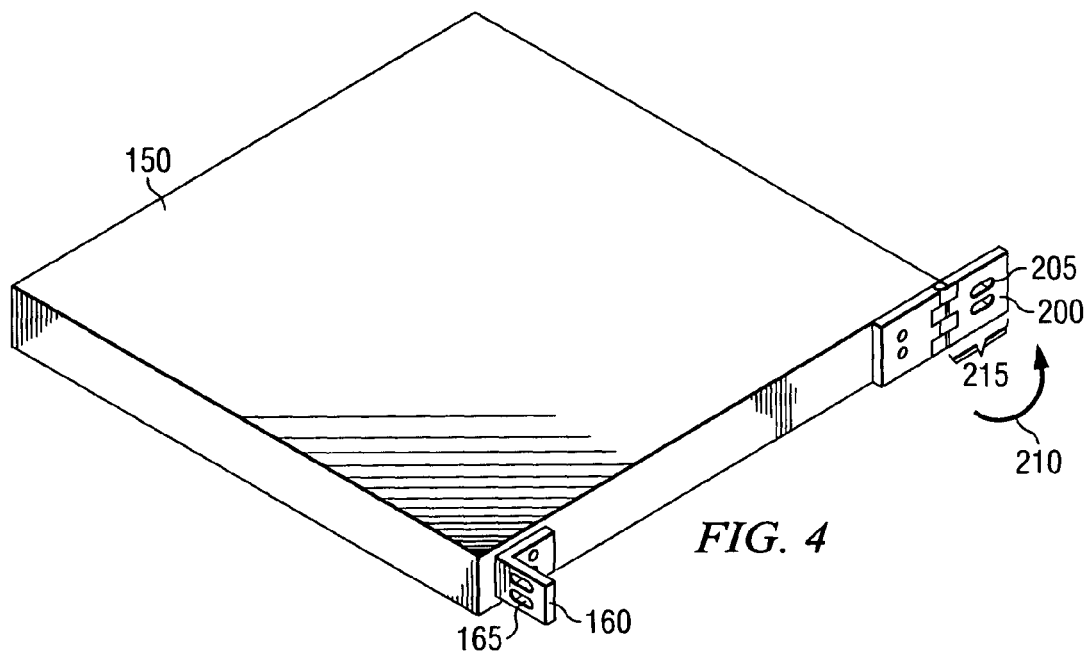
FIGS. 4 and 5 are perspective views of a mounting assembly for mounting the equipment in accordance with embodiments of the present invention.
Figure 5:
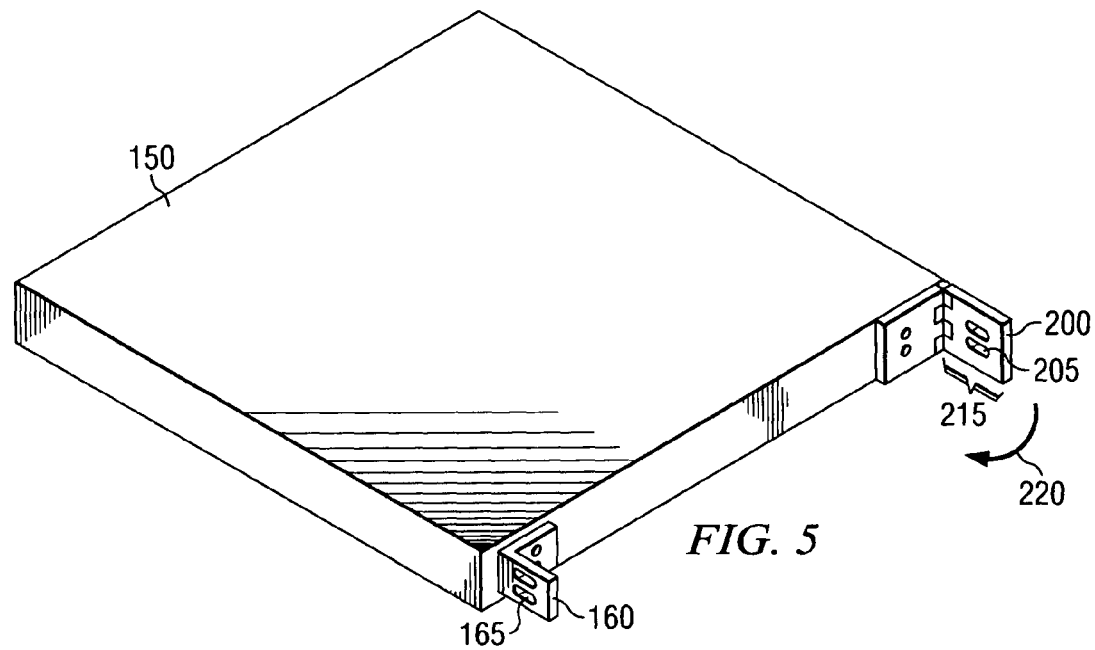

However, in some situations, it may be difficult or impossible to access the side panels of the frame. Therefore, in accordance with embodiments of the present invention, as shown in FIGS. 4 and 5, instead of using angle metal brackets on both the front sides and back sides of the equipment 150, angle metal brackets 160 are used on only the front sides of the equipment and metal hinges 200 are used on the back sides of the equipment 150. The metal hinges 200 are moveable between an extended position 210 for moving the equipment 150 relative to the frame and a folded position 220 for attaching the equipment 150 to the frame. In particular, the extended position 210 enables the equipment 150 to be inserted into and removed from the frame via the front of the frame without requiring side access to the frame.

Referring now to FIG. 4, to mount the equipment 150 in accordance with embodiments of the present invention, one bracket 160 is attached to each front side of the equipment 150 by, for example, threading screws or other fasteners through both the mounting holes 165 on the equipment-face of the brackets 160 and the corresponding mounting holes on the front sides of the equipment 150. In addition, one hinge 200 is attached to each back side of the equipment 150 by, for example, threading screws or other fasteners through both the mounting holes 205 on the equipment-face of the hinges 200 and the corresponding mounting holes on the back sides of the equipment 150.

When the brackets 160 are attached to the opposing front sides of the equipment 150 and the hinges 200 are attached to the opposing back sides of the equipment, the hinges 200 are placed in the elongated position 210 by folding extended portions 215 of the hinges 200 extending out from the equipment 150 towards the back of the equipment 150 so that the extended portions 215 are parallel to the equipment-face of the hinges 200 to ensure that the extended portions 215 lie inside of the frame rails while the equipment 150 is inserted through the front of the frame. Therefore, the equipment 150 can be easily inserted through the front of the frame with the hinges 200 already on the equipment 150.

Once the brackets 160 abut the front pair of rails 140, bolts or other fasteners are threaded through the mounting holes 165 on the frame-face of the brackets 160 and corresponding mounting holes on the front rails 140 of the frame to mount the equipment 150 to the front pair of rails 140. In addition, referring now to FIG. 5, the hinges 200 can be attached to the back of the frame by folding the hinges 200 out from the equipment 150 to the folded position 210 such that the extended portions 215 of the hinges 200 are folded over respective back rails, and threading bolts or other fasteners through the mounting holes 205 on the extended portions 215 of the hinges 200 and corresponding mounting holes on the back rails of the frame.

Likewise, to remove the equipment 150 from the frame, the hinges 200 are detached from the back rails, and the hinges 200 are placed in the extended position 210 (as shown in FIG. 4) to allow the equipment 150 to be slid out of the front of the frame. This can be done with merely back access to the frame to remove the bolts or other fasteners attaching the back rails to the hinges 200. Therefore, side access is not required for mounting or removing equipment 150 from the frame.

FIG. 6 is a flowchart illustrating an exemplary process 600 for mounting equipment in a frame in accordance with embodiments of the present invention. Initially, at block 610, brackets are fastened to the two opposing front sides of the equipment, and at block 620, hinges are fastened to the two opposing back sides of the equipment. Thereafter, at block 630, the equipment is inserted through the front of the frame with the hinges in an elongated position folded to the inside of the rails. At block 640, the brackets are bolted to the front rails of the frame to secure the equipment to the front of the frame. The hinges are then folded over the back rails of the frame at block 650, and at block 660, the hinges are bolted to the back rails to secure the equipment to the back of the frame.

FIG. 7 is a flowchart illustrating an exemplary process 700 for removing mounted equipment from a frame in accordance with embodiments of the present invention. Initially, at block 710, the bolts attaching the hinges to the back rails are removed to detach the equipment from the back of the frame. Thereafter, at block 720, the hinges are folded to the elongated position so that the hinges lie inside of the rails while the equipment is being removed from the frame. At block 730, the bolts attaching the brackets to the front rails are removed to detach the equipment from the front of the frame, and at block 740, with the hinges in the elongated position, the equipment is slid out of the frame from the front of the frame to remove the equipment from the frame.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

I claim:

1. A mounting assembly for mounting equipment on a frame having a front pair of vertical rails and a back pair of vertical rails, said mounting assembly comprising:
    a bracket for attaching a front side of said equipment to one of said front pair of rails; and
    a hinge for attaching a back side of said equipment to one of said back pair of rails;
    wherein said hinge is moveable between an extended position for moving said equipment relative to said frame and a folded position for attaching said equipment to said frame;
    wherein said extended position enables said equipment to be inserted into and removed from said frame via a front of said frame defined by said front pair of rails.

2. The mounting assembly of claim 1, further comprising:
    an additional bracket for attaching the other front side of said equipment to the other one of said front pair of vertical rails; and
    an additional hinge for attaching the other back side of said equipment to the other one of said back pair of vertical rails.

3. The mounting assembly of claim 1, wherein said extended position is such that an extended portion of said hinge extending out from said equipment is inside of said front pair of vertical rails and said back pair of vertical rails and said folded position is such that said extended portion of said hinge is folded over said one of said back pair of rails.

4. The mounting assembly of claim 1, wherein said bracket has a first aperture therein for receiving a first fastener for attaching said bracket to said front side of said equipment and a second aperture therein for receiving a second fastener for attaching said bracket to said one of said front pair of rails.

5. The mounting assembly of claim 4, wherein said hinge has a first aperture therein for receiving a third fastener for attaching said hinge to said back side of said equipment and a second aperture therein for receiving a fourth fastener for attaching said hinge to said one of said back pair of rails.

6. The mounting assembly of claim 5, wherein each rail within said front and back pairs of rails has vertically spaced and aligned apertures therein for receiving said second and fourth fasteners.

7. A mounting assembly for mounting equipment on a frame having a front pair of vertical rails defining a front of said frame and a back pair of vertical rails defining a back of said frame, said mounting assembly comprising:
    a pair of brackets for attaching respective front sides of said equipment to respective ones of said front pair of rails; and
    a pair of hinges attaching respective back sides of said equipment to respective ones of said back pair of rails in a folded position and for inserting said equipment into and removing said equipment from said front of said frame in an extended position;
    wherein said extended position is such that respective extended portions of said hinges extending out from said equipment are inside of said front pair of vertical rails and said back pair of vertical rails and said folded position is such that said respective extended portions of said hinges are folded over said respective ones of said back pair of rails.

8. The mounting assembly of claim 7, wherein each of said brackets has a respective first aperture therein for receiving a respective first fastener for attaching said respective bracket to said respective front side of said equipment and a respective second aperture therein for receiving a respective second fastener for attaching said respective bracket to said respective one of said front pair of rails.

9. The mounting assembly of claim 8, wherein each of said hinges has a respective first aperture therein for receiving a respective third fastener for attaching said respective hinge to said respective back side of said equipment and a respective second aperture therein for receiving a respective fourth fastener for attaching said respective hinge to said respective one of said back pair of rails.

10. The mounting assembly of claim 9, wherein each rail within said front and back pairs of rails has vertically spaced and aligned apertures therein for receiving said respective second and fourth fasteners.

11. A method for mounting equipment on a frame having a front pair of vertical rails defining a front of said frame and a back pair of vertical rails defining a back of said frame, said method comprising the steps of:
 fastening respective brackets to respective front sides of said equipment;
 fastening respective hinges to respective back sides of said equipment;
 inserting said equipment into said front side of said frame with said hinges in an extended position such that extended portions of said hinges extending out from said equipment are inside of said front pair of vertical rails and said back pair of vertical rails;
 attaching said respective brackets to respective ones of said front pair of rails, said attaching including:
  inserting said equipment into said front of said frame until said brackets abut said front pair of rails; and
  threading respective bolts through respective apertures in said brackets and said front pair of rails to secure said equipment to said front pair of rails;
 moving said hinges to a folded position such that said extended portions of said hinges are folded over respective ones of said back pair of rails; and
 attaching said hinges to said respective ones of said back pair of rails.

12. The method of claim 11, wherein said step of attaching said hinges further comprises the step of:
 threading respective bolts through respective apertures in said extended portions of said hinges and said back pair of rails to secure said equipment to said back pair of rails.

13. The method of claim 11, further comprising the step of:
 removing said equipment from said frame.

14. The method of claim 13, wherein said step of removing further comprises the steps of:
 detaching said hinges from said respective ones of said back pair of rails;
 moving said hinges to said extended position;
 detaching said brackets from said respective ones of said front pair of rails; and
 sliding said equipment out of said frame through said front of said frame.

* * * * *